US009773694B2

(12) United States Patent
Kobayashi et al.

(10) Patent No.: US 9,773,694 B2
(45) Date of Patent: Sep. 26, 2017

(54) METHOD FOR MANUFACTURING BONDED WAFER

(71) Applicant: Shin-Etsu Handotai Co., Ltd., Tokyo (JP)

(72) Inventors: Norihiro Kobayashi, Takasaki (JP); Hiroji Aga, Takasaki (JP)

(73) Assignee: SHIN-ETSU HANDOTAI CO., LTD., Tokyo (JP)

(*) Notice: Subject to any disclaimer, the term of this patent is extended or adjusted under 35 U.S.C. 154(b) by 0 days.

(21) Appl. No.: 15/120,905

(22) PCT Filed: Feb. 12, 2015

(86) PCT No.: PCT/JP2015/000635
§ 371 (c)(1),
(2) Date: Aug. 23, 2016

(87) PCT Pub. No.: WO2015/141121
PCT Pub. Date: Sep. 24, 2015

(65) Prior Publication Data
US 2016/0365273 A1    Dec. 15, 2016

(30) Foreign Application Priority Data

Mar. 18, 2014   (JP) ................................. 2014-054427

(51) Int. Cl.
*H01L 21/30*  (2006.01)
*H01L 21/46*  (2006.01)
(Continued)

(52) U.S. Cl.
CPC .. *H01L 21/76254* (2013.01); *H01L 21/02052* (2013.01); *H01L 21/26506* (2013.01);
(Continued)

(58) Field of Classification Search
CPC ......... H01L 21/76254; H01L 21/26506; H01L 21/3226; H01L 21/76251; H01L 21/84; H01L 21/02658
See application file for complete search history.

(56) References Cited

U.S. PATENT DOCUMENTS 5,374,564 A    12/1994  Bruel
6,362,076 B1    3/2002  Inazuki et al.
(Continued)

FOREIGN PATENT DOCUMENTS

JP    H05-211128 A    8/1993
JP    H11-307472 A    11/1999
(Continued)

OTHER PUBLICATIONS

Sep. 20, 2016 International Preliminary Report on Patentability issued in International Patent Application No. PCT/JP2015/000635.
(Continued)

*Primary Examiner* — Zandra Smith
*Assistant Examiner* — John M Parker
(74) *Attorney, Agent, or Firm* — Oliff PLC

(57) ABSTRACT

A method for manufacturing a bonded wafer, includes: ion-implanting a gas ion such as a hydrogen ion from a surface of a bond wafer, thereby forming an ion-implanted layer; bonding the bond wafer and a base wafer; producing a bonded wafer having a thin-film on the base wafer by delaminating the bond wafer along the ion-implanted layer; and performing an RTA treatment on the bonded wafer in a hydrogen gas-containing atmosphere; wherein a protective film is formed onto the surface of the thin-film in a heat treatment furnace in the course of temperature-falling from the maximum temperature of the RTA treatment before the bonded wafer is taken out from the heat treatment furnace; and then the bonded wafer with the protective film being (Continued)

formed thereon is taken out from the heat treatment furnace, and is then cleaned with a cleaning liquid which can etch the protective film and the thin-film.

8 Claims, 3 Drawing Sheets

(51) Int. Cl.
  *H01L 21/762* (2006.01)
  *H01L 27/12* (2006.01)
  *H01L 21/265* (2006.01)
  *H01L 21/324* (2006.01)
  *H01L 21/02* (2006.01)

(52) U.S. Cl.
  CPC ...... *H01L 21/26533* (2013.01); *H01L 21/324* (2013.01); *H01L 21/3247* (2013.01); *H01L 27/12* (2013.01)

(56) References Cited

U.S. PATENT DOCUMENTS

| | | | |
|---|---|---|---|
| 6,372,609 B1* | 4/2002 | Aga | H01L 21/76254 |
| | | | 257/E21.568 |
| 7,759,254 B2* | 7/2010 | Sasaki | H01L 21/02052 |
| | | | 438/480 |
| 2007/0161199 A1* | 7/2007 | Morita | H01L 21/76256 |
| | | | 438/311 |
| 2008/0261376 A1* | 10/2008 | Yamazaki | H01L 21/2007 |
| | | | 438/406 |
| 2009/0023269 A1* | 1/2009 | Morimoto | H01L 21/324 |
| | | | 438/458 |
| 2010/0120223 A1 | 5/2010 | Kobayashi et al. | |
| 2010/0129993 A1 | 5/2010 | Yokokawa et al. | |
| 2012/0009797 A1* | 1/2012 | Reynaud | H01L 21/76254 |
| | | | 438/756 |
| 2014/0322895 A1 | 10/2014 | Kobayashi et al. | |

FOREIGN PATENT DOCUMENTS

| | | |
|---|---|---|
| JP | 2000-124092 A | 4/2000 |
| JP | 2009-027124 A | 2/2009 |
| JP | 2009-032972 A | 2/2009 |
| JP | 2012-222294 A | 11/2012 |
| JP | 2013-143407 A | 7/2013 |
| WO | 2010/122023 A2 | 10/2010 |
| WO | 2011/113775 A1 | 9/2011 |

OTHER PUBLICATIONS

May 19, 2015 International Search Report issued in International Patent Application No. PCT/JP2015/000635.
Dec. 2, 2016 Office Action issued in Taiwanese Patent Application No. 104105976.
Dec. 2, 2016 Search Report issued in Taiwanese Patent Application No. 104105976.

* cited by examiner notch

METHOD FOR MANUFACTURING BONDED WAFER

TECHNICAL FIELD

The present invention relates to a method for manufacturing a bonded wafer by an ion-implantation delamination method, and particularly to a method for manufacturing an SOI wafer in which a silicon single crystal wafer being implanted with a hydrogen ion is bonded with a base wafer as a support wafer through an oxide film and is then delaminated.

BACKGROUND ART

As a method for manufacturing an SOI wafer, especially for manufacturing a thin-film SOI wafer that can improve the performance of an advanced integrated circuit, a method for delaminating an ion-implanted wafer after bonding to manufacture an SOI wafer (an ion-implantation delamination method: technology that is also called the Smart Cut method (a registered trademark)) has been received attention.

This ion-implantation delamination method is technology that forms an oxide film on at least one of two wafers, implants gas ions such as hydrogen ions or rare gas ions from an upper surface of one silicon wafer (a bond wafer), forms a micro bubble layer (a sealed layer) in the interior of the bond wafer, then adhering the surface from which the ions are implanted to the other silicon wafer (a base wafer) through the oxide film, subsequently performs a heat treatment (a delamination heat treatment) to delaminate the bond wafer into a thin film-form by making the micro bubble layer be a cleaved surface (a delaminated surface), and further performs a heat treatment (a bonding heat treatment) to strengthen the bonding, thereby manufacturing an SOI wafer (see Patent Document 1). In this stage, the cleaved surface becomes a surface of a SOI layer, and an SOI wafer having a thin SOI film with high thickness uniformity can be obtained relatively easily. When obtaining a bonded wafer in which wafers are directly bonded, instead of an SOI wafer, the bond wafer and the base wafer are directly adhered and bonded with each other without forming an oxide film onto either surface thereof.

The surface of the SOI wafer after delamination, however, contains a damaged layer due to ion implantation, and has surface roughness larger than that of a mirror surface of a regular silicon wafer. Accordingly, in the ion-implantation delamination method, such a damage layer or surface roughness have to be removed.

Conventionally, to remove this damage layer or the like, mirror polishing with a very small polishing stock removal (a stock removal: approximately 100 nm), which is called touch polish, is carried out at a final step after the bonding heat treatment. However, when the SOI layer is subjected to polishing including machine work, since the polishing stock removal is not uniform, there arises a problem of deteriorating film thickness uniformity of the SOI layer achieved by implantation of hydrogen ions, etc. and delamination.

As a method for solving such a problem, a high temperature heat treatment are displacing the aforementioned touch polishing to perform a flattening treatment that improves surface roughness.

For example, Patent Document 2 proposes a method of performing a heat treatment (a rapid heating/rapid cooling heat treatment (an RTA treatment)) in a reducing atmosphere containing hydrogen without polishing a surface of an SOI layer after a delamination heat treatment (or a bonding heat treatment). Patent Document 3 proposes a method in which an oxide film is formed onto an SOI layer by a heat treatment in an oxidizing atmosphere after a delamination heat treatment (or a bonding heat treatment), and then the oxide film is removed (a sacrificial oxidation treatment), followed by performing an RTA treatment in a reducing atmosphere. Patent Documents 4 to 6 propose a method of performing a sacrificial oxidation treatment after performing an RTA treatment, and a method in which the plural number of RTA treatments and sacrificial oxidation treatments are performed.

In manufacturing an SOI wafer by an ion-implantation delamination method, it is usual to perform a treatment to adjust the film thickness of the SOI layer to an intended film thickness such as a sacrificial oxidation treatment or polishing after performing a heat treatment to flatten the delaminated surface such as the foregoing RTA treatment and so on (Patent Documents 4 to 6).

Before put into such a treatment to adjust the film thickness, an SOI wafer is usually subjected to cleaning process. In the cleaning process, it is usual to perform cleaning in which an SOI wafer is dipped into cleaning liquid which functions to slightly etch the surface of an SOI layer such as SC1 (mixed solution of $NH_4OH$ and $H_2O_2$).

CITATION LIST

Patent Literature

Patent Document 1: Japanese Unexamined Patent publication (Kokai) No. H05-211128
Patent Document 2: Japanese Unexamined Patent publication (Kokai) No. H11-307472
Patent Document 3: Japanese Unexamined Patent publication (Kokai) No. 2000-124092
Patent Document 4: Japanese Unexamined Patent publication (Kokai) No. 2009-032972
Patent Document 5: Japanese Unexamined Patent publication (Kokai) No. 2012-222294
Patent Document 6: Japanese Unexamined Patent publication (Kokai) No. 2013-143407

SUMMARY OF INVENTION

Problem to be Solved by the Invention

On the other hand, with recent spread of portable terminals, reduction in power consumption, miniaturization, and high functionality of semiconductor devices are required, and a fully depleted device using an SOI wafer has been developed as a strong candidate in 22 nm and subsequent generations based on design rules. In this fully depleted device, the film thickness of an SOI layer is very thin such as 10 nm or so, and a film thickness distribution of an SOI layer affects a threshold voltage of the device, and accordingly, the radial film thickness distribution of the SOI layer is required to have uniformity in which the film thickness range is about 1 nm or less (Range (Max-Min)≤1 nm).

In manufacturing an SOI wafer with such small film thickness range, however, it is difficult to maintain the radial and inter-wafer film thickness uniformity of an SOI layer(s) after flatting and adjusting the film thickness to be favorable. This is because the film thickness uniformity of an SOI layer is deteriorated in a cleaning step performed after a flattening heat treatment, which is performed to improve the surface roughness of the SOI layer surface after delamination, although the film thickness uniformity of the SOI layer is favorable when the bond wafer was delaminated.

Particularly, when the cleaning is performed by using SC1 as a cleaning liquid, the thickness of an SOI layer is securely reduced by etching. Accordingly, the radial film thickness uniformity of an SOI layer tends to deteriorate depending on the cleaning condition. There is a problem that the radial film thickness uniformity of an SOI layer is particularly opt to deteriorate when combining with a flattening heat treatment such as an RTA treatment, in which a wafer is taken out from a heat treatment furnace with the SOI layer surface being in an active state due to the heat treatment.

Such a deterioration of radial film thickness uniformity of an SOI layer comes to be a particularly big issue when manufacturing an SOI wafer with a film thickness range of 1 nm or less as mentioned above.

The present invention was accomplished to solve the above-described problems. It is an object of the present invention to provide a method for manufacturing a bonded wafer which can maintain the radial film thickness uniformity of a thin-film to be favorable even after performing an RTA treatment and subsequent cleaning.

Means for Solving Problem

To solve the problems, the present invention provides a method for manufacturing a bonded wafer, comprising: ion-implanting at least one gas ion selected from a hydrogen ion and a rare gas ion from a surface of a bond wafer, thereby forming an ion-implanted layer into the inside of the wafer; bonding the ion-implanted surface of the bond wafer and a surface of a base wafer directly or through an insulating film; followed by producing a bonded wafer having a thin-film on the base wafer by delaminating the bond wafer along the ion-implanted layer; and flattening the surface of the thin-film by performing an RTA treatment on the bonded wafer in a hydrogen gas-containing atmosphere; wherein a protective film is formed onto the surface of the thin-film in a heat treatment furnace in the course of temperature-falling from the maximum temperature of the RTA treatment before the bonded wafer is taken out from the heat treatment furnace; and then the bonded wafer with the protective film being formed thereon is taken out from the heat treatment furnace, and is then cleaned with a cleaning liquid which can etch the protective film and the thin-film.

Such a method for manufacturing a bonded wafer can manufacture a bonded wafer in which the radial film thickness uniformity of the thin-film is maintained to be favorable even after performing an RTA treatment and subsequent cleaning by forming a protective film with radial uniformity onto the thin-film flattened by the RTA treatment.

In this case, it is preferred that the protective film is formed by changing the hydrogen gas-containing atmosphere in the heat treatment furnace to any of an oxidizing atmosphere, a nitriding atmosphere, and an oxynitriding atmosphere in the course of temperature-falling from the maximum temperature of the RTA treatment; thereby exposing the bonded wafer to any of the oxidizing atmosphere, the nitriding atmosphere, and the oxynitriding atmosphere to form any of an oxide film, a nitride film, and an oxynitride film onto the surface of the thin-film.

This makes it possible to easily form the protective film onto the surface of the thin-film.

An aqueous mixed solution of $NH_4OH$ and $H_2O_2$ (SC1) can be used as the cleaning liquid.

In the present invention, it is possible to maintain the radial film thickness uniformity of the thin-film after cleaning to be favorable even when the cleaning is performed with SC1, which has an etching property and is generally used for cleaning.

The protective film is preferably formed with a thickness of 0.7 to 3 nm.

Such a thickness sufficiently gives an effect of the protective film and does not largely lower the productivity of the RTA treatment.

Effect of Invention

As described above, in a method for manufacturing a bonded wafer of the present invention, it is possible to easily form a protective film onto the surface of the thin-film flattened by an RTA treatment. By this protective film formed onto the surface of the thin-film with radial uniformity, it is possible to manufacture a bonded wafer in which the radial film thickness uniformity of the thin-film after cleaning is maintained to be favorable even when the cleaning is performed with SC1, which has an etching property, after the RTA treatment.

DESCRIPTION OF EMBODIMENTS

Figure 1:
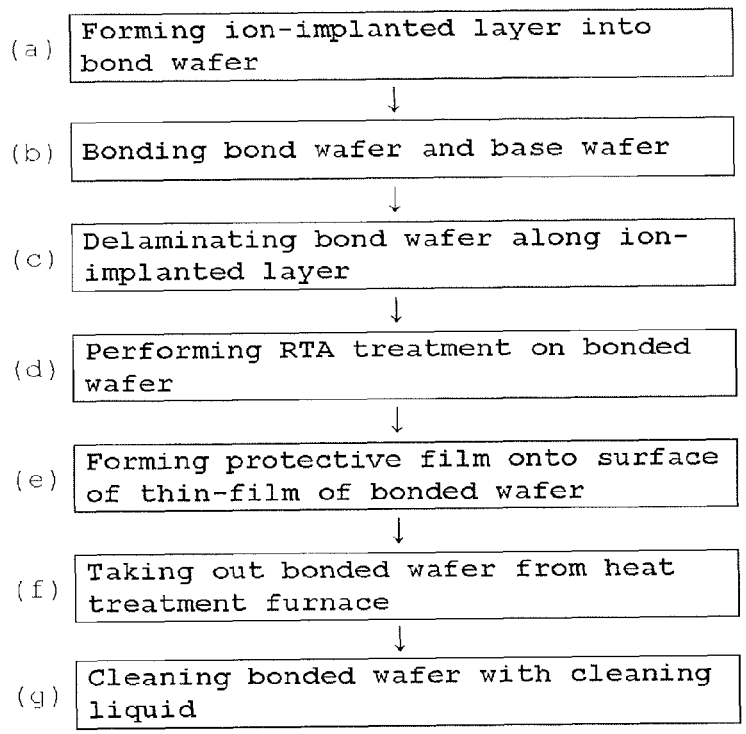
FIG. 1 illustrates a flowchart of an example of the method for manufacturing a bonded wafer of the present invention.

The inventors have investigated the foregoing problem and found that the radial film thickness uniformity of an SOI layer scarcely tends to deteriorate in a cleaning step including SC1 cleaning subsequent to a flattening heat treatment performed in a batch furnace of a resistance heating type, on the other hand, the radial film thickness uniformity of the SOI layer tends to deteriorate in a cleaning step including SC1 cleaning subsequent to a high temperature RTA treatment in an $H_2$-containing atmosphere, which exhibits a high flatten effect. In measurements of film thicknesses of an SOI layer immediately after an RTA treatment, the radial film thickness distribution of the SOI layer showed more uniform distribution compared to the same after cleaning with SC1. On the basis of these, it is considered that an RTA treatment is the reason for deteriorating the film thickness uniformity of the SOI layer, and cleaning including SC1 increases the factor.

It has also found that in RTA treatments using the same apparatus, it is regularly a particular region where the film thickness of each SOI layer can be thin after an RTA treatment and cleaning; on the other hand, in different apparatuses, the film thickness of each SOI layer can be thin at different regions depending on the apparatus, for example, some apparatuses form SOI layers in which the center portion of each wafer is thin, some apparatuses form SOI layers in which the periphery of each wafer is thin, etc.

Further investigation has revealed that, the SOI layer is thin at the center of the wafer when the wafer is taken out after an RTA treatment by a wafer handling robot which is brought into contact with a wafer at the center of the wafer, and the SOI layer is thin at the periphery of the wafer when the robot is brought into contact with a wafer at the periphery of the wafer. Accordingly, it has found that the SOI layer is thin at a position where a wafer handling robot is brought into contact with the wafer.

It is supposed that this is caused by the following reason. In a high temperature wafer after an RTA treatment, the portion come in contact with a wafer handling robot, which is low temperature, gets temperature lowering. In the temperature lowered portion, the growing oxide film (a native oxide film) gets thinner than the other portions. The portion with a thinner oxide film is etched in a short time compared to the other regions in subsequent cleaning with SC1. As a result, in the portion with thinner oxide film, the substrate Si (an SOI layer) is more etched, thereby getting the SOI layer thinner.

On the basis of the foregoing, the inventors have conceived that it is possible to maintain the radial film thickness uniformity of a thin-film (an SOI layer) after cleaning to be favorable by suppressing a formation of a native oxide film with a non-uniform film thickness formed after an RTA treatment. Specifically, the inventors have found that it is possible to maintain the radial film thickness uniformity of the thin-film after cleaning to be favorable by growing a protective film (an oxide film, a nitride film, an oxynitride film, etc.) forcedly on the thin-film subsequently to purge $H_2$ after finishing anneal of an RTA treatment, since the protective film can suppress to form a native oxide film with non-uniform film thickness if it gets temperature lowering by coming contact with a wafer handling robot when it is subsequently taken out; thereby bringing the present invention to completion.

That is, the present invention is a method for manufacturing a bonded wafer, comprising: ion-implanting at least one gas ion selected from a hydrogen ion and a rare gas ion from a surface of a bond wafer, thereby forming an ion-implanted layer into the inside of the wafer; bonding the ion-implanted surface of the bond wafer and a surface of a base wafer directly or through an insulating film; followed by producing a bonded wafer having a thin-film on the base wafer by delaminating the bond wafer along the ion-implanted layer; and flattening the surface of the thin-film by performing an RTA treatment on the bonded wafer in a hydrogen gas-containing atmosphere; wherein a protective film is formed onto the surface of the thin-film in a heat treatment furnace in the course of temperature-falling from the maximum temperature of the RTA treatment before the bonded wafer is taken out from the heat treatment furnace; and then the bonded wafer with the protective film being formed thereon is taken out from the heat treatment furnace, and is then cleaned with a cleaning liquid which can etch the protective film and the thin-film.

Hereinafter, the present invention will be explained in detail, but the present invention is not limited thereto.

FIG. 1 is a flowchart to show an example of the method for manufacturing a bonded wafer of the present invention. Hereinafter, the inventive method for manufacturing a bonded wafer will be explained with referring to the flowchart in FIG. 1.

In the method for manufacturing a bonded wafer of the present invention, a bond wafer and a base wafer are prepared at first, and an ion-implanted layer is formed in the bond wafer (FIG. 1 (a)).

As the bond wafer and the base wafer, which are not particularly limited, a mirror-polished silicon single crystal wafer can be suitably used, for example.

As the bond wafer and the base wafer, it is also possible to use a wafer with the surface having an oxide film (an insulator film) formed by thermal oxidation.

When forming the ion-implanted layer in a bond wafer, the ion-implanted layer can be formed into the inside of the wafer by ion-implanting at least one gas ion selected from a hydrogen ion and a rare gas ion from a surface of a bond wafer, and this can be performed by a well-known method.

Subsequently, the bond wafer, in which the ion-implanted layer is formed, and the base wafer are bonded (FIG. 1 (b)). In the bonding, the ion-implanted surface of the bond wafer and a surface of the base wafer are bonded directly or bonded with an insulator film interposed therebetween when using a bond wafer or a base wafer having an insulator film formed thereon as described above.

Then, the bond wafer is delaminated along the ion-implanted layer (FIG. 1 (c)). This delamination of the bond wafer can be performed by a heat treatment (a delaminating heat treatment) in an atmosphere of inert gas such as Ar, for example, although the method is not particularly limited. It is also possible to delaminate mechanically without a delamination treatment (or only with a low-temperature heat treatment that does not cause delamination) by performing a plasma treatment onto the surface to be bonded in advance, thereby enhancing the bond strength of the wafers closely adhered at room temperature.

The bond wafer is delaminated along the ion-implanted layer as described above to give a bonded wafer in which the base wafer having a thin-film formed thereon.

Subsequently, an RTA treatment is performed on the obtained bonded wafer (FIG. 1 (d)). In this step, the surface of the thin-film is flattened by performing the RTA treatment in a hydrogen gas-containing atmosphere. It is also possible to perform a bonding heat treatment (e.g., 900 to 1000° C., 30 minutes to 2 hours, in an oxidizing atmosphere) to enhance the bonding strength of a bonded wafer before the RTA treatment, and to perform a treatment to remove a thermal oxidation film formed on the surface.

The hydrogen gas-containing atmosphere can be an atmosphere of 100% $H_2$ gas or a mixed gas atmosphere of $H_2$ and Ar, for example.

It is preferable that the maximum temperature of the RTA treatment is 1,100° C. or more, and the treating time (retention time at the maximum temperature) is approximately 1 to 30 seconds.

In the method for manufacturing a bonded wafer of the present invention, a protective film is formed onto the surface of the thin-film in a heat treatment furnace in the course of temperature-falling from the maximum temperature of the RTA treatment before the bonded wafer is taken out from the heat treatment furnace (FIG. 1 (e)).

In this case, it is preferred that the protective film is formed by changing the hydrogen gas-containing atmosphere in the heat treatment furnace to any of an oxidizing atmosphere, a nitriding atmosphere, and an oxynitriding atmosphere in the course of temperature-falling from the maximum temperature of the RTA treatment; thereby exposing the bonded wafer to any of the oxidizing atmosphere, the nitriding atmosphere, and the oxynitriding atmosphere to form any of an oxide film, a nitride film, and an oxynitride film onto the surface of the thin-film. Such a method can easily form the protective film onto the surface of the thin-film.

The formation of a protective film have only to be performed at a temperature below the maximum temperature of an RTA treatment. For example, it can be performed by exposing a bonded wafer into the oxidizing atmosphere, the nitriding atmosphere, or the oxynitriding atmosphere at 300 to 900° C. for about 5 to 30 seconds so as to adjust to the desired film thickness, although the condition is not particularly limited.

The thickness of the formed protective film is preferably in a range of 0.7 to 3 nm, although it is not particularly limited. The effect of the protective film can be sufficiently obtained by the thickness of 0.7 nm or more. On the other hand, when the thickness is 3 nm or less, it does not take too long for forming the protective film, and accordingly the productivity does not largely lowered even in an RTA treatment, which is single wafer processing.

By forming such a protective film with radial uniformity onto the surface of a thin-film flattened by an RTA treatment, it is possible to suppress a formation of native oxide film with non-uniform film thickness. As a result, the radial variation of an etching amount can be suppressed in cleaning with SC1 and so on described below subsequent to the RTA treatment, and accordingly the radial film thickness uniformity of the thin-film can be maintained to be favorable even after cleaning.

Subsequently, the bonded wafer having a protective film formed thereon is taken out from the heat treatment furnace after forming the protective film as described above (FIG. 1 (f)).

Then, the bonded wafer is cleaned with a cleaning liquid which can etch the protective film and the thin-film (FIG. 1 (g)).

In this case, an aqueous mixed solution of $NH_4OH$ and $H_2O_2$ (SC1) may be used as the cleaning liquid. In the present invention, it is possible to maintain the radial film thickness uniformity of the thin-film after cleaning to be favorable even when the cleaning is performed with SC1. Naturally, the cleaning liquid is not limited thereto, and it is also possible to use NaOH, KOH, etc., or to perform cleaning combined with non-etching cleaning liquid (e.g., SC2 (an aqueous mixed solution of HCl and $H_2O_2$)).

After the foregoing cleaning, it is possible to perform a sacrificial oxidation treatment with a batch furnace (resistance heating type heat treatment furnace) or a heat treatment in a non-oxidizing atmosphere (e.g., high temperature Ar anneal treatment) in accordance with needs. These treatments are not particularly limited, and can be performed by a well-known method.

Subsequently, the film thickness may be adjusted by a sacrificial oxidation treatment, etc. This can be performed by a well-known method, which is not particularly limited.

As described above, in the method for manufacturing a bonded wafer of the present invention, it is possible to easily form a protective film onto the surface of a thin-film flattened by an RTA treatment. By this protective film formed onto the surface of the thin-film with radial uniformity, it is possible to manufacture a bonded wafer in which the radial film thickness uniformity of the thin-film after cleaning is maintained to be favorable even when the cleaning is performed with SC1 after the RTA treatment.

EXAMPLE

The present invention will be more specifically described below with referring to Example and Comparative Example, but the present invention is not limited to thereto.

Example

A bond wafer cut out from a silicon single crystal with a diameter of 300 mm was prepared. Onto this bond wafer, an oxide film was grown at 950° C. so as to have a film thickness of 150 nm. Subsequently, hydrogen ions are implanted in a condition of 40 keV and $6.0 \times 10^{16}/cm^2$. Then, a base wafer cut out from a silicon single crystal with a diameter of 300 mm was prepared and bonded with the bond wafer. Subsequently, the bonded wafer was subjected to a delamination heat treatment at 500° C./30 minutes to produce a bonded SOI wafer. On the SOI wafer immediately after the delamination, the average film thickness and the film thickness range of the SOI layer were measured.

Figure 2:
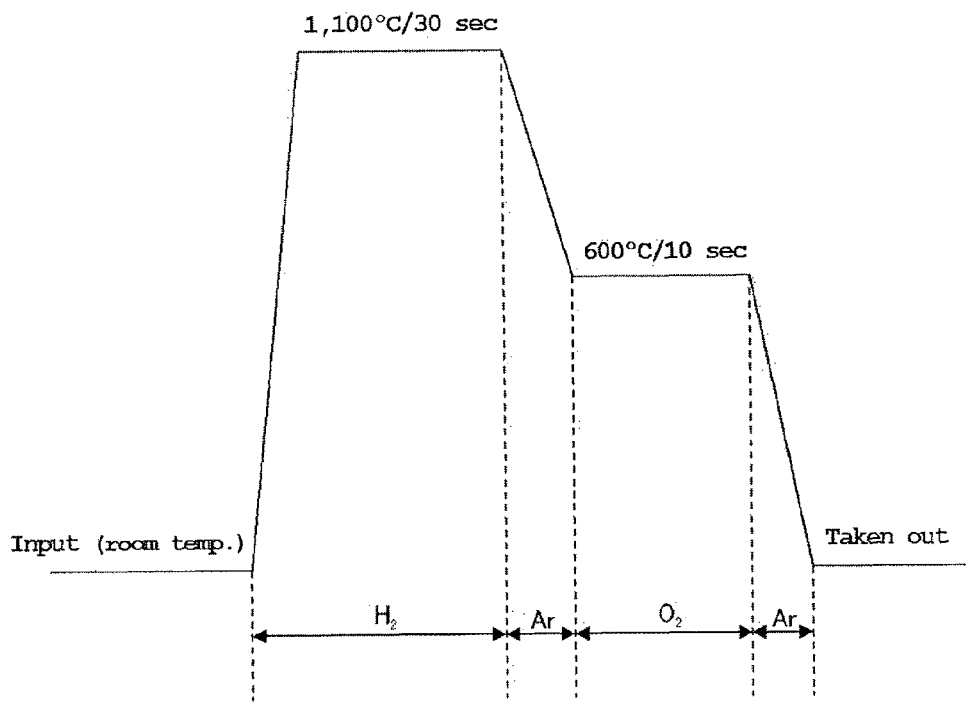
FIG. 2 illustrates a diagram to show an RTA temperature profile in an RTA treatment in Example.

Subsequently, an RTA treatment (the first flattening heat treatment) was performed onto the produced SOI wafer on the basis of an RTA temperature profile in FIG. 2. In the RTA treatment, an anneal treatment at 1,100° C./30 seconds in $H_2$ atmosphere was performed at first. After a finish of the anneal, in which the maximum temperature was held for a prescribed time, the temperature was decreased while purging $H_2$ gas from the chamber with Ar gas, and the atmosphere was changed to $O_2$ gas (oxidizing atmosphere) at 600° C. to perform oxidation at 600° C./10 seconds, thereby forming an oxide film as a protective film onto the surface of an SOI layer.

Then, the SOI wafer was taken out from the heat treatment furnace by a wafer handling robot. On the SOI wafer immediately after the RTA treatment, the film thicknesses of the oxide film on the SOI layer were measured.

Subsequently, the SOI wafer taken out from the heat treatment furnace was cleaned with SC1, and then subjected to a sacrificial oxidation treatment, a high-temperature Ar anneal treatment (the second flattening heat treatment) at 1,200° C./60 minutes, and a sacrificial oxidation treatment to adjust the film thickness of the SOI layer to give an SOI wafer in which flattening and adjusting the film thickness had finished. The average film thickness and the film thickness range of the SOI layer were measured on the obtained SOI wafer in which flattening and adjusting the film thickness had finished.

Table 1 shows the condition of each treatment in Example.

TABLE 1

| | |
|---|---|
| Bond wafer | Diameter: 300 mm, Crystal orientation: <100>, Oxide film: 150 nm |
| Base wafer | Diameter: 300 mm, Crystal orientation: <100>, Oxide film: none |
| Ion-implantation | $H^+$ ion, 40 keV, $6 \times 10^{16}/cm^2$ |
| Delamination heat treatment | 500° C./30 min., Ar atmosphere |
| RTA treatment | 1,100° C./30 sec., $H_2$ atmosphere + formation of protective film (600° C./10 sec., $O_2$ atmosphere) |
| Cleaning | SC1 (75° C./180 sec.) |
| High-temperature Ar anneal treatment | 1,200° C./60 min., Ar atmosphere |
| Sacrificial oxidation treatment | 950° C., pyrogenic oxidation |
| Removal of oxide film (sacrificial oxidation) | 10% aqueous HF solution |

Comparative Example

Figure 3:
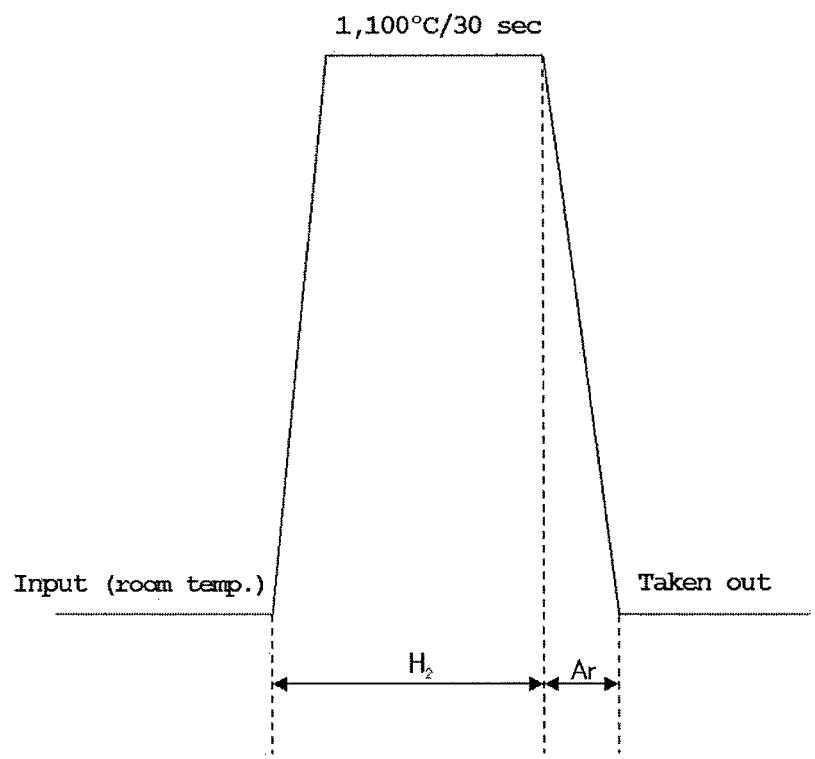
FIG. 3 illustrates a diagram to show an RTA temperature profile in an RTA treatment in Comparative Example.

On an SOI wafer produced by performing operations as in Example up to the delamination heat treatment, an RTA treatment (the first flattening heat treatment) was performed on the basis of an RTA temperature profile in FIG. 3. In this RTA treatment, the atmosphere was not changed to an oxidizing atmosphere after purged with Ar gas subsequent to annealing, and an oxide film as a protective film was not formed. After the RTA treatment, the SOI wafer was taken out from the heat treatment furnace by a wafer handling robot. On the SOI wafer immediately after the RTA treatment, the film thicknesses of the oxide film on the SOI layer were measured as in Example.

The subsequent cleaning with SC1 and treatment of flattening and adjusting the film thickness were performed as in Example to give an SOI wafer in which flattening and adjusting the film thickness had finished. The average film thickness and the film thickness range of the SOI layer were measured on the obtained SOI wafer in which flattening and adjusting the film thickness had finished.

Figure 4:
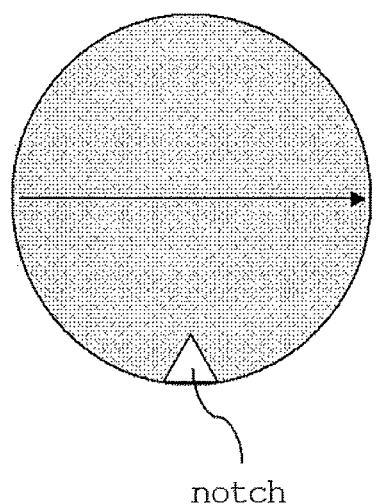
FIG. 4 illustrates a figure to show a measurement direction when measuring the film thickness of an oxide film on an SOI layer immediately after an RTA treatment in Example and Comparative Example.

It is to be noted that the measurements were performed in a direction of arrow in FIG. 4 when measuring oxide film thicknesses on the SOI layers of the SOI wafers immediately after RTA treatments in Example and Comparative Example. The measurement results are compared and shown as a graph in FIG. 5.

Figure 5:
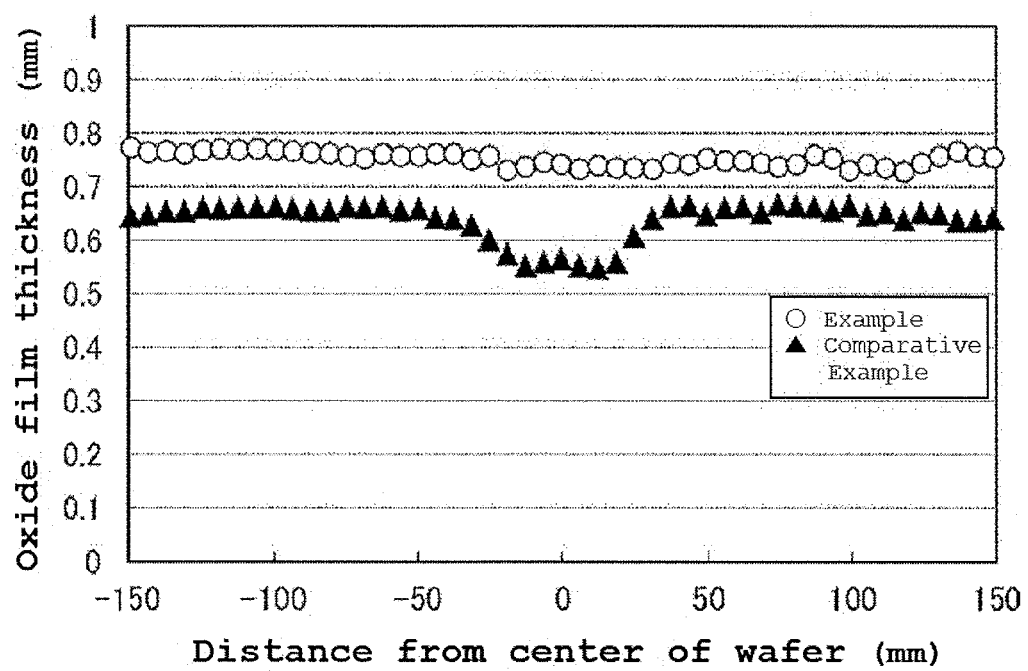
FIG. 5 illustrates a graph to compare the results of measuring film thicknesses of each oxide film on an SOI layer immediately after an RTA treatment in Example and Comparative Example.

The wafer handling robot used in Example and Comparative Example was in a form of chucking the center portion of a wafer. In Example, wherein an oxide film was formed as a protective film, the oxide film thickness on the SOI layer immediately after the RTA treatment was uniform in-plane as shown in FIG. 5.

On the other hand, in Comparative Example, wherein a protective film was not formed, the oxide film (native oxide film) on the SOI layer immediately after the RTA treatment showed a tendency in which the center portion of the wafer was thinner.

Table 2 shows results of each average film thickness and film thickness range of the SOI layer measured on the SOT wafers immediately after the delamination and SOI wafers in which flattening and adjusting the film thickness had finished in Example and Comparative Example.

TABLE 2

| | | Example | Comparative Example |
|---|---|---|---|
| SOI layer immediately after delamination | Average film thickness (nm) | 276.4 | 276.9 |
| | Film thickness range (nm) | 0.83 | 0.81 |
| SOI layer after flattening & adjusting film thickness | Average film thickness (nm) | 12.2 | 12.1 |
| | Film thickness range (nm) | 0.81 | 1.23 |

In Example, wherein a protective film was formed, the film thickness range of the SOI layer was maintained to be a favorable value equivalent to the value immediately after the delamination even after the flattening and adjusting the film thickness as shown in Table 2.

On the other hand, in Comparative Example, wherein a protective film was not formed, the film thickness range of the SOI layer got thinner at the center portion of the wafer, and the radial film thickness uniformity was deteriorated.

As described above, it has revealed that in a method for manufacturing a bonded wafer of the present invention, it is possible to easily form a protective film onto the surface of the thin-film flattened by an RTA treatment; and by this protective film formed onto the surface of the thin-film with radial uniformity, it is possible to maintain the radial film thickness uniformity of the thin-film after cleaning to be favorable even when the cleaning is performed with SC1 after the RTA treatment.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a bonded wafer, comprising:
    ion-implanting at least one gas ion selected from a hydrogen ion and a rare gas ion from a surface of a bond wafer, thereby forming an ion-implanted layer into the inside of the wafer;
    bonding the ion-implanted surface of the bond wafer and a surface of a base wafer directly or through an insulating film;
    followed by producing a bonded wafer having a thin-film on the base wafer by delaminating the bond wafer along the ion-implanted layer; and
    flattening the surface of the thin-film by performing an RTA treatment while supplying hydrogen gas, which is a single wafer processing, on the bonded wafer in a hydrogen gas-containing atmosphere; wherein
        a protective film is formed onto the surface of the thin-film in a heat treatment furnace in the course of temperature-falling from the maximum temperature of the RTA treatment before the bonded wafer is taken out from the heat treatment furnace; and then
        the bonded wafer with the protective film being formed thereon is taken out from the heat treatment furnace, and is then cleaned with a cleaning liquid that can etch the protective film and the thin-film.

2. The method for manufacturing a bonded wafer according to claim 1, wherein the protective film is formed by changing the hydrogen gas-containing atmosphere in the heat treatment furnace to any of an oxidizing atmosphere, a nitriding atmosphere, and an oxynitriding atmosphere in the course of temperature-falling from the maximum temperature of the RTA treatment; thereby exposing the bonded wafer to any of the oxidizing atmosphere, the nitriding atmosphere, and the oxynitriding atmosphere to form any of an oxide film, a nitride film, and an oxynitride film onto the surface of the thin-film.

3. The method for manufacturing a bonded wafer according to claim 2, wherein the cleaning liquid is an aqueous mixed solution of $NH_4OH$ and $H_2O_2$.

4. The method for manufacturing a bonded wafer according to claim 3, wherein the protective film is formed with a thickness of 0.7 to 3 nm.

5. The method for manufacturing a bonded wafer according to claim 2, wherein the protective film is formed with a thickness of 0.7 to 3 nm.

6. The method for manufacturing a bonded wafer according to claim 1, wherein the cleaning liquid is an aqueous mixed solution of $NH_4OH$ and $H_2O_2$.

7. The method for manufacturing a bonded wafer according to claim 6, wherein the protective film is formed with a thickness of 0.7 to 3 nm.

8. The method for manufacturing a bonded wafer according to claim 1, wherein the protective film is formed with a thickness of 0.7 to 3 nm.

\* \* \* \* \*